United States Patent [19]

Umemura et al.

[11] Patent Number: 4,624,833

[45] Date of Patent: Nov. 25, 1986

[54] LIQUID METAL ION SOURCE AND APPARATUS

[75] Inventors: Kaoru Umemura, Kokubunji; Tohru Ishitani, Sayama; Toshiyuki Aida, Chofu; Hifumi Tamura, Hachioji, all of Japan

[73] Assignee: Hitachi, Ltd., Tokyo, Japan

[21] Appl. No.: 674,771

[22] Filed: Nov. 26, 1984

[30] Foreign Application Priority Data

Nov. 28, 1983 [JP] Japan ................................ 58-222033

[51] Int. Cl.⁴ .............................................. H01J 1/05
[52] U.S. Cl. .................... 420/490; 313/362.1; 315/425; 315/492.1; 420/497; 420/499

[58] Field of Search ...................... 315/111.31, 111.81; 313/163, 232, 230, 362.1; 250/425–427, 492.1, 492.2, 492.3; 266/200; 420/499, 497, 490

[56] References Cited

U.S. PATENT DOCUMENTS

| 4,318,029 | 3/1982 | Jergenson | 315/111.81 |
| 4,318,030 | 3/1982 | Jergonson | 315/111.81 |
| 4,367,429 | 1/1983 | Wang et al. | 313/362.1 |
| 4,453,078 | 6/1984 | Shimizu | 250/425 |

Primary Examiner—Christopher W. Brody
Attorney, Agent, or Firm—Antonelli, Terry & Wands

[57] ABSTRACT

A liquid metal ion source for emitting P ions, wherein a Cu alloy which contains at most 25 at. % of P and if necessary, further contains Ag, C or Si, and/or B is melted and fed to an emitter tip so as to generate an ion beam under a high electric field.

16 Claims, 6 Drawing Figures

LIQUID METAL ION SOURCE AND APPARATUS

BACKGROUND OF THE INVENTION

The present invention relates to ion sources for an ion implanter, an ion beam writing apparatus, etc., and more particularly to a liquid metal ion source from which the ion species of a high vapor pressure element P can be extracted as the ions of the single element efficiently and stably for a long time.

As performances have been enhanced in the fields of micro-dry processes (such as ion beam exposure, dry developement and microdoping), a submicron surface analysis, etc., it has been eagerly desired to develop a liquid metal ion source of high brightness. Particularly in the field of electro-devices, it has been attempted to use liquid metal ion sources from which the ions of Ga, Si, Be etc. being dopant species can be extracted, and to directly dope (implant) semiconductor materials with the dopants.

The operating principle of these liquid metal ion sources is as follows. First, an emitter made of tungsten W, tantalum Ta, carbon C, or the like is supplied with a source feed material (a material which contains the element of a desired ion beam and which shall hereinafter be termed a "source material") melted by resistance heating or by electron-beam bombardment, laser-beam irradiation or the like. Secondly, an intense electric field is applied to the tip of the emitter, and the ions of the source material are extracted from the emitter tip by field ionization. Accordingly, it is important for the ion source that the desired ion beam can be extracted stably for a long time.

Meantime, one of the most important elements among n-type impurity elements for a silicon semiconductor is P, while one among p-type impurity elements is B. There has not hitherto been any concrete report on the emission of P ions from a liquid metal ion source.

The P element has a melting point of 44.1° C., at which its vapor pressure is as high as 0.181 mmHg, and hence, it is difficult to use the P element as the source material of a liquid metal ion source. Therefore, a method becomes effective in which the difficulty is relieved in the form of an alloy composed of P and a metal or metals other than P, a liquid metal containing P is formed under the condition of a high temperature, the ions of the alloy constituting elements are extracted using the alloy as a source material under the condition of a high electric field, and only P ions are separated and obtained by mass separation. It is accordingly an important point to search for the source material which contains P, namely, the alloy from which the P ions can be extracted stably and for a long time.

The Official Gazette of Japanese Laid-open Patent Application No. 57-132653 discloses a source material which is made of an alloy composed of a transition element and at least one metalloid element selected from the group consisting of Al, As, B, C, Ge, In, P, Si and Sn. However, the transition elements concretely mentioned include only Ni, Pd, Pt, La, Au and Fe. As will be described later, a source material in a liquid metal ion source according to the present invention is a Cu-P-based alloy. The aforementioned official gazette contains quite no statement indicating that this alloy is especially excellent. In order to show the state of the art of the present invention, besides the aforementioned official gazette, (i) the Official Gazette of Japanese Laid-open Patent Application No. 57-30243 and (ii) the Official Gazette of Japanese Laid-open Patent Application No. 58-178944 can be mentioned.

SUMMARY OF THE INVENTION

An object of the present invention is to eliminate the difficulties of the prior arts, and to provide a liquid metal ion source from which a P ion beam or both a P ion beam and a B ion beam can be extracted and which is stable in operation and long in lifetime.

In order to accomplish the object, the liquid metal ion source of the present invention employs as its source material, (i) a Cu alloy which contains at most 25 at. % of P; (ii) the Cu alloy of (i), which further contains at most 15 at. % of B; (iii) the Cu alloy of (i), which further contains at most 16 at. % of Ag, C or Si; or (iv) the Cu alloy of (ii), which further contains at most 10 at. % of Ag, C or Si. When such alloy compositions are specified into binary, ternary and quaternary alloys by general formulae, they are respectively expressed as (i') an alloy which is indicated by a general formula $Cu_X P_Y$ where $0 < Y \leq 25$ and $X = 100 - Y$; (ii') an alloy which is indicated by a general formula $Cu_X P_Y B_Z$ where $0 < Y \leq 25$, $0 < Z \leq 15$ and $X = 100 - Y - Z$; (iii') an alloy which is indicated by a general formula $Cu_X P_Y M_A$ where M denotes Ag, C or Si and where $0 < Y \leq 25$, $0 < A \leq 16$ and $X = 100 - Y - A$; or (iv') an alloy which is indicated by a general formula $Cu_X P_Y B_Z M_{A'}$ where M denotes Ag, C or Si and where $0 < Y \leq 25$, $0 < Z \leq 15$, $0 < A' \leq 10$ and $X = 100 - Y - Z - A'$. In the above general formulae, the letters X, Y, Z, A and A' also indicate at. %.

A more preferable range of the P content of the source material is 10−20 at.% (that is, $10 < Y < 20$), and the most preferable P content is approximately 15.8 at. % (that is, $Y \approx 15.8$) corresponding to the eutectic point of the Cu—P binary alloy. When the P content exceeds 25 at. %, unfavorably P is liable to volatilize away from the liquid metal. When the P content is 10-20 at. %, favorably the liquidus temperature of the alloy lowers to about 900° C., so the alloy is easily melted, and the quantity of emission ions becomes large owing to the properly high P content. This favorable tendency is more conspicuous when the P content of the alloy corresponds to the eutectic point thereof. Besides, when the B content of the source material exceeds 15 at. %, unfavorably the melting point of the liquid metal rises.

By adding at most 16 at. % of Ag, C or Si in the Cu-P alloy or at most 10 at. % in the Cu-P-B alloy, the fluidity of the liquid metal is increased, and the flow of the liquid metal from the reservoir thereof to the tip of an emitter is stabilized, so that a favorable result is obtained.

Next, the ordinary structure of the liquid metal ion source according to the present invention is constructed of a reservoir which melts and holds the source material described above, an emitter which is arranged so as to emit from its tip the ions of the melted source material fed from the reservoir, and an extracting electrode which applies a high electric field between it and the emitter so as to extract the ions from the emitter tip.

The ion beam extracted from the emitter tip is such that the ions of respective constituent elements in the alloy of the source material coexist. This ion beam is therefore subjected to mass separation, whereby the ion beam of a desired element can be obtained.

In melting the source material, it is possible to employ resistance heating in which current is caused to flow through a resistor, or heating which is based on electron-beam bombardment, laser-beam irradiation or the like. The resistance heating is convenient because the reservoir can be used also as a heater. The material of the reservoir serving also as the heater is, for example, Nb, Ta, Mo or C. Besides, a material to construct the emitter is, for example, W, Ta, C, SiC, WC, TiC or LaB$_6$, or such material to which one or more different elements are somewhat added.

Usually, the emitter and the reservoir are separate portions. However, when a capillary tube, for example, is employed for the emitter and is formed so as to reserve the source material therein, the reservoir and the emitter become unitary.

With the liquid metal ion source of the present invention, P ions which have hitherto been deemed difficult of emission from a liquid metal ion source, or B ions as well as the P ions are permitted to be emitted stably and for a long time, with the result that the provision of the liquid metal ion source for emitting the P ions has become possible.

In the liquid metal ion source of the present invention, matters not mentioned in this specification may conform to past knowledge in the art.

DESCRIPTION OF THE PRESENTLY PREFERRED EMBODIMENTS

Example 1

Figure 1:
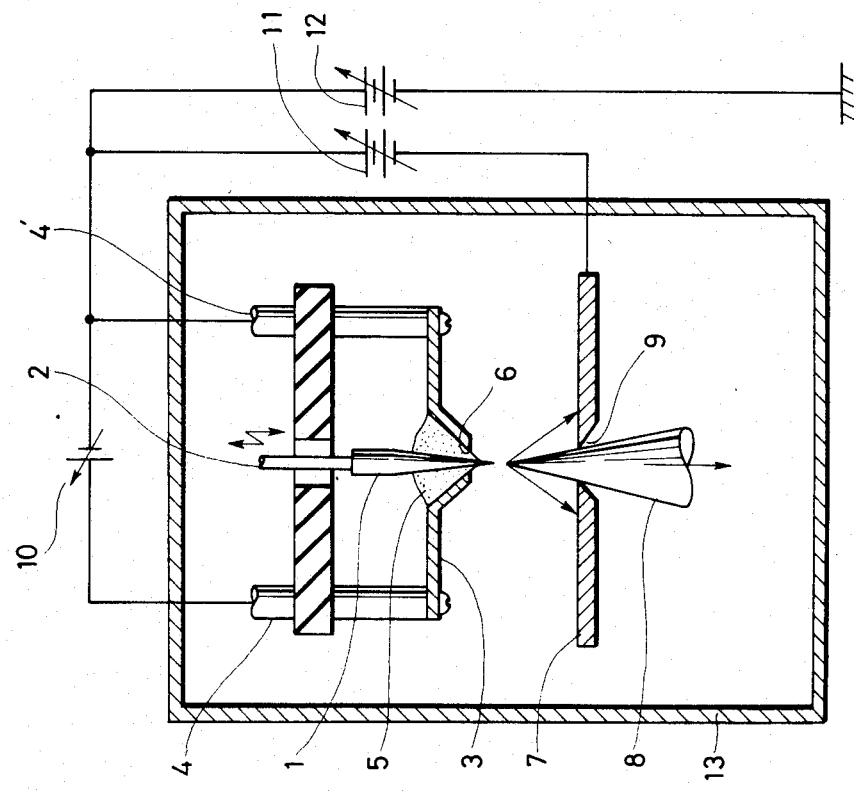
FIG. 1 is a schematic sectional view of a liquid metal ion source in an embodiment of the present invention.

FIG. 1 is a schematic sectional view which shows the fundamental setup of a liquid metal ion source according to the present invention. The way of melting a source material 5 in this ion source is of the current conduction heating type. An emitter 1 is connected to and supported by a supporter 2. This supporter 2 can be finely moved up and down from outside a vacuum chamber 13 by means of a vertical fine adjustment mechanism as disclosed in the aforecited official gazette of Japanese Laid-open Patent Application No. 58-178944 entitled "Liquid metal ion source". The flow of the source material 5 wetting the emitter 1, to the tip of the emitter 1 can be controlled by the vertical fine movements. A reservoir 3, which serves also as a current conduction heater for melting the source material 5, is fixed to current introducing terminals 4 and 4' at both the ends thereof. The reservoir 3 is centrally provided with a circular hole 6 through which the emitter 1 wetted with the melted source material 5 passes. FIG. 1 illustrates the state in which the emitter 1 wetted with the melted source material 5 protrudes from the circular hole 6 of the reservoir 3. Numeral 7 designates an ion extracting electrode. By applying an electric field of several kV across this extracting electrode 7 and the emitter 1, an ion beam 8 generated by field ionization can be extracted from the tip of the emitter 1 downwards via a through hole 9 which is provided in the extracting electrode 7. In case of the present embodiment, the emitter 1 is made of tungsten W and has a diameter of 0.5 mm, and its tip is sharpened into a radius of curvature less than several μm by electrolytic polishing. The reservoir 3 serving also as the heater is made of a niobium (Nb) plate having a thickness of 0.1 mm, and a recess provided in the central part thereof is so machined that the source material 5 can be reserved by about 5 mm$^3$. The diameter of the circular hole 6 provided centrally of the reservoir 3 is about 1.5 mm.

In FIG. 1, numeral 10 denotes a heating power supply, numeral 11 an extracting power supply, and numeral 12 an accelerating power supply.

Since the source material 5 forms an important point of the present invention, it will be described in detail here.

Conditions required of the source material 5 are that the melting point is up to approximately 1000° C. at the most, that the vapor pressure at the temperature is low, that when C (especially, glassy carbon), W, Ta, an SiC-based material, a WC-based material, a TiC-based material or an LaB$_6$-based material which is usable at high temperatures for a long time is employed as the material of the emitter, the source material reacts therewith in quite no amount or in a small amount, and that the wettability is favorable.

Concretely, unless the source material 5 is properly selected, problems listed below arise, and the P ion beam cannot be extracted. Or, granted that it can be extracted, there arises the fatal disadvantage that an emitted ion current is astable or that the lifetime of the ion source is as very short as below 1 hour. The problems are:

(1) Since the vapor pressure of the melted source material is high, the vaporization is violent, and the element ions intended to be extracted are depleted in a short time.

(2) The emitter tip and the melted source material react violently, and the extraction of the ion beam stops in a short time.

(3) The extraction of the ion beam is difficult for such a reason that the viscosity of the melted source material is too high or that the wettability thereof with the emitter tip is inferior.

In consideration of the problems as mentioned above, various alloys containing P were studied. As a result, it has been revealed that a Cu-P-based alloy and a Cu-P-B-based alloy are the source materials 5 which can achieve the object.

Figure 2:
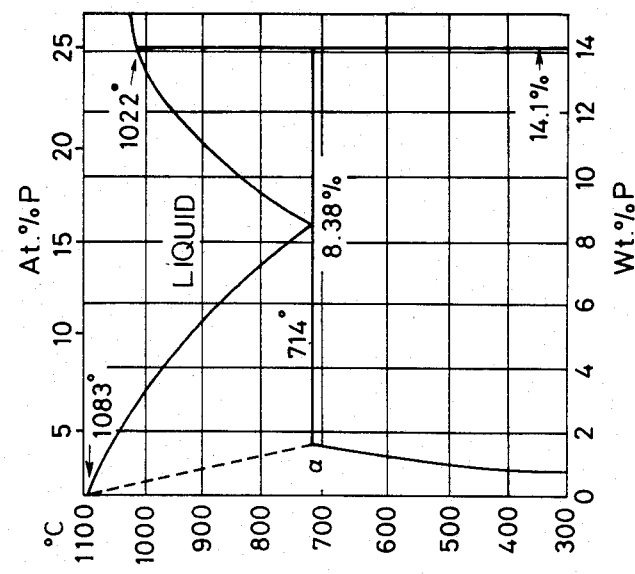
FIG. 2 is an equilibrium phase diagram of a Cu—P alloy which was used as a source material in an example of the present invention.

The source feed material 5 used in Example 1 was Cu$_{84}$P$_{16}$. A phase diagram of Cu-P is shown in FIG. 2 (reference literature: Metals Reference Book, FIFTH EDITION. Editor COLIN J. SMITHELLS; issudsed by BUTTERWORTHS). As seen from the diagram, the melting point of this substance is approximately 714° C.

Figure 3:
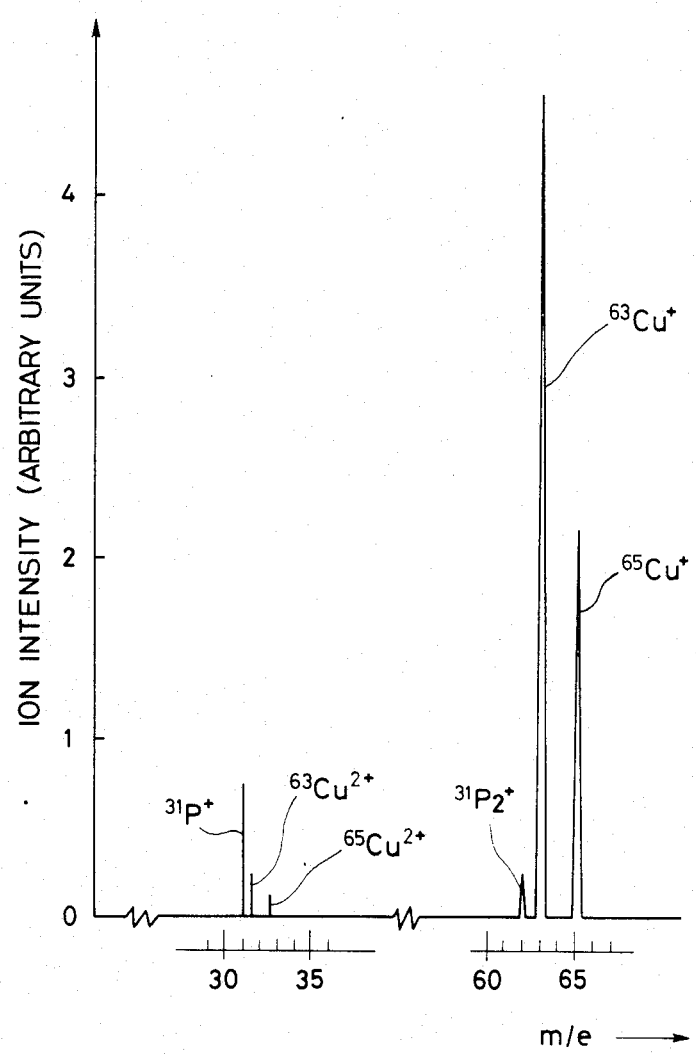
FIG. 3 is a diagram showing a mass spectrum in Example 1.

When the ion source was actually operated at about 750° C., the emission of the stable ion beam 8 could be attained. The ion beam 8 was subjected to mass separation, and an example of a mass spectrum was observed as shown in FIG. 3. Here, the axis of abscissas represents the mass-to-charge ratio m/e, while the axis of ordinates represents the ion intensity (arbitrary units). The voltage of the extracting electrode at this time was 6.3 kV, and the total ion current was approximately 80 μA. It has been known from the result of the mass analysis experiment that the greater part of the emission ion current derived from the ion source was Cu+ ions, that about 10% was P+ ions and that ions $P_2^+$, $Cu^{2+}$ etc. were also derived. As the lifetime of the ion source, a period of at least 50 hours has been achieved.

Regarding the composition of the $Cu_XP_Y$ alloy, ones of $0 < Y \leq 25$ (where $X = 100 - Y$) are applicable as understood from the equilibrium phase diagram of FIG. 2. It has been acknowledged that stable P+ ions can be extracted with the alloys of various compositions in the above range. In this regard, the melting point differs depending upon the compositions. By way of example, the alloys whose P contents (atomic percent) Y were substantially $10 < Y < 20$ could be used for the operations of the ion sources at 900° C.

EXAMPLE 2

In Example 2, a liquid metal ion source was the same in construction as that employed in Example 1, except an emitter 1, a reservoir 3 serving also as a heater, and a source material 5. The source material 5 used in Example 2 was $Cu_{84}P_{10}B_6$, and the emitter 1 and the reservoir 3 were respectively made of SiC and C in order to avoid their reactions with B at a high temperature operation.

Figure 4:
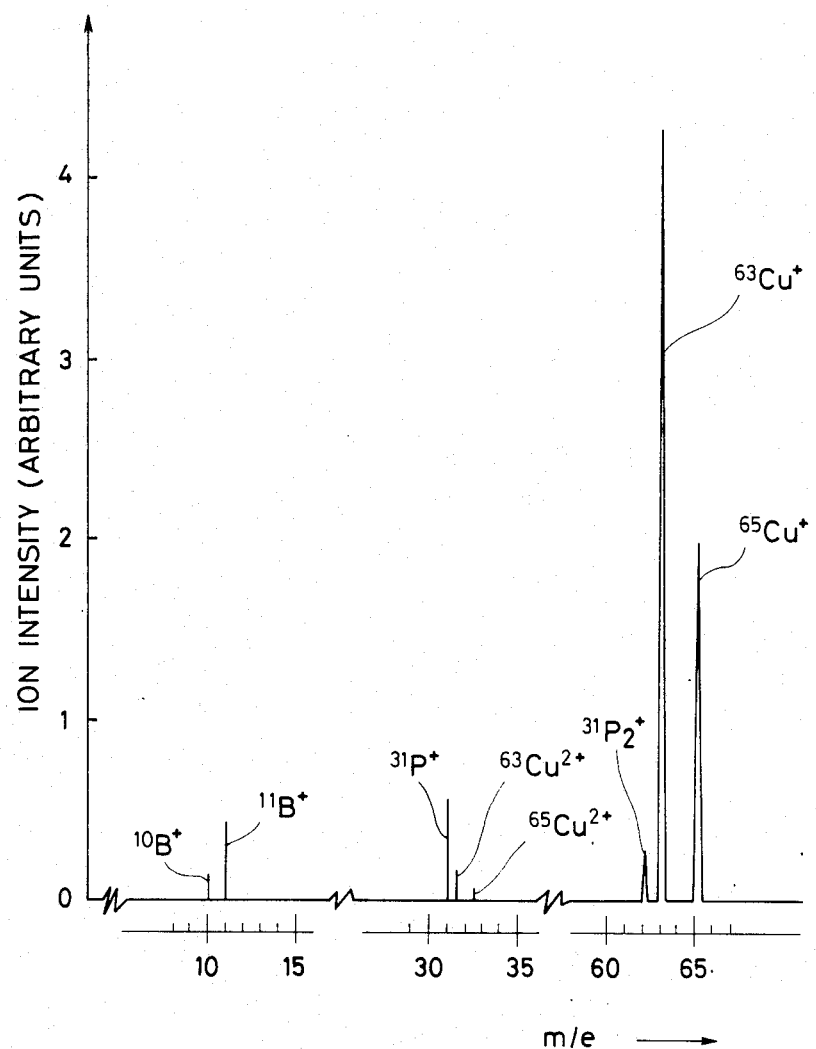
FIG. 4 is a diagram showing a mass spectrum in Example 2.

By operating the ion source at about 900° C., the emission of a stable ion beam 8 could be attained. An example of a mass spectrum obtained through the mass separation of the ion beam 8 is shown in FIG. 4. The voltage of the extracting electrode at this time was 7.5 kV, and the total ion current was about 70 μA. It could be acknowledged that the greater part of the emission ion current derived from the ion source was Cu+ ions, but that about 3% to about 10% of P+ ions and B+ ions were respectively emitted. It is accordingly the feature of the ion source that the ions of P being an n-type impurity for a silicon semiconductor and the ions of B being a p-type impurity can be extracted therefrom. As the lifetime of this ion source, a period of at least 30 hours has been achieved.

Example 3

In Example 3, except a source material 5, a liquid metal ion source was the same in construction as that employed in Example 1. The source material 5 used in Example 3 was $Cu_{83}P_{13}Ag_4$ in the case where M was selected to be Ag in a general formula $Cu_XP_YM_A$ (where M denotes one element among Ag, C and Si).

Figure 5:
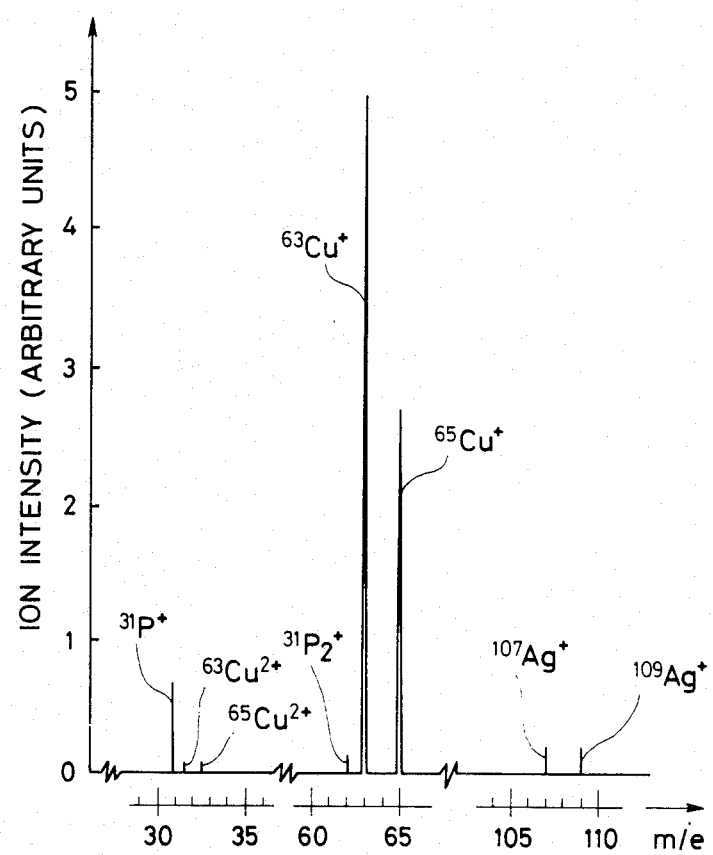
FIG. 5 is a diagram showing a mass spectrum in Example 3.

By operating the ion source at about 750° C., the emission of a stable ion beam 8 could be attained. An example of a mass spectrum obtained through the mass separation of the ion beam 8 is shown in FIG. 5. The voltage of the extracting electrode was set at 6.8 kV. It can be acknowledged from FIG. 5 that desired P+ ions are emitted from the ion source by about 5–6% though the greater part of the emission ion current derived from the ion source is Cu+ ions. As the most important effect of Example 3, the melting point of the source material 5 does not greatly differ from those in Examples 1 and 2, but the fluidity thereof is very favorable as compared with those in Examples 1 and 2, so that the flow of the melted source material 5 to the tip of the emitter 1 is stable. Thus, also the stability of the emission of the ion beam 8 becomes very favorable. In addition, the lifetime of the ion source was at least 30 hours.

While Ag was used as M in Example 3, similar results were produced even when Ag was replaced with C or Si.

Example 4

In Example 4, except a source material 5, a liquid metal ion source was the same in construction as that employed in Example 2. The source material 5 used in Example 4 was $Cu_{79}P_{10}B_6Ag_5$ in the case where M was selected to be Ag in a general formula $Cu_XP_YB_ZM_{A'}$ (where M denotes one element among Ag, C and Si).

Figure 6:
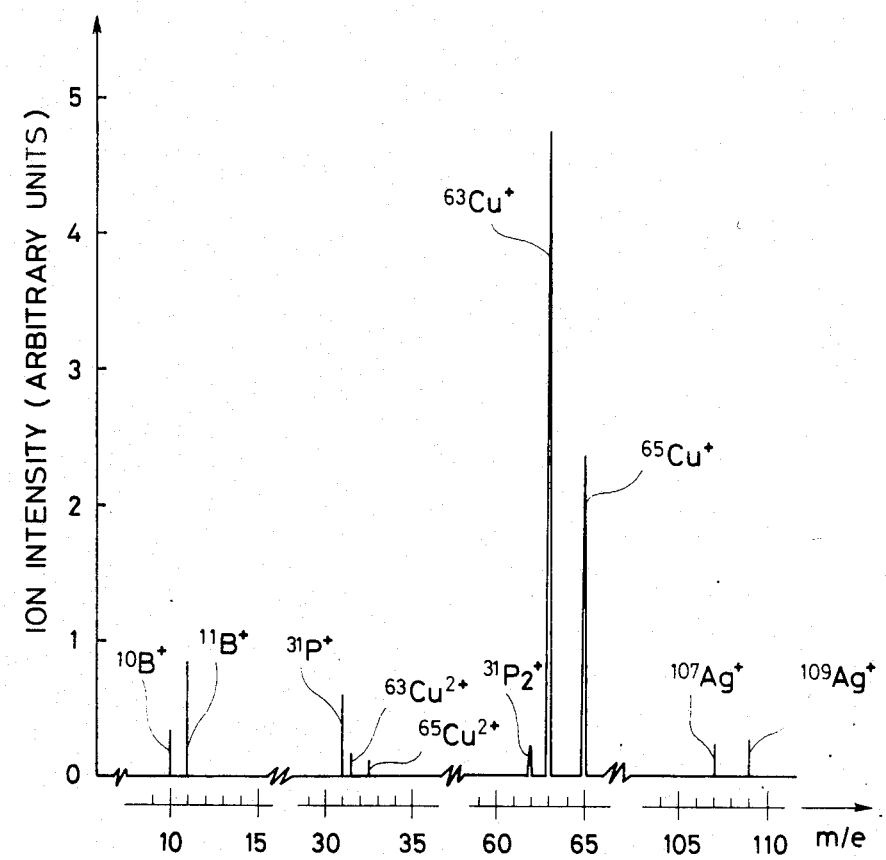
FIG. 6 is a diagram showing a mass spectrum in Example 4.

By operating the ion source at about 930° C., the emission of a stable ion beam 8 could be attained. An example of a mass spectrum obtained through the mass separation of the ion beam 8 is shown in FIG. 6. The voltage of the extracting electrode at this time was 8.0 kV, and the total ion current was about 80 μA. It can be acknowledged from FIG. 6 that the emission ion current derived from the ion source was Cu+ ions for the most part, but that about 5–6% of P+ ions and about 15–16% of B+ ions were emitted. As the effects of Example 4, the P+ ions being an n-type impurity for a silicon semiconductor and the B+ ions being a p-type impurity can be extracted from the ion source, and the fluidity is favorable enough to produce a stable emission ion current. As the lifetime of the ion source, a period of at least 10 hours has been achieved.

While, in each of the examples, the emitter 1 was made of the material of tungsten W or silicon carbide SiC machined in the shape of a needle, similar effects were obtained even when emitters were made of different materials such as tantalum Ta and carbon C. Besides, while the reservoir 3 serving also as the heater was the carbon (C) plate or the niobium (Nb) plate in each of the examples, favorable results were obtained even with tantalum (Ta) and molybdenum (Mo).

While the examples were of the system wherein the needle-shaped emitter is employed as the emitter 1, it is also allowed to adopt a system wherein a capillary tube is employed so as to reserve the source material 5 therein, or a system wherein a fine needle-like emitter is passed inside a capillary tube so as to reserve the source material 5 in the interspace between the capillary tube and the needle-like emitter.

Further, the heater of the current conduction heating system may well be replaced with electron-beam bombardment or laser-beam irradiation.

As thus far described, the present invention consists in that a liquid metal in which P or both P and B is/are contained in Cu is used as an ion source. As understood from the foregoing examples, however, a liquid metal in which a different element is further added to these constituents so as to stabilize the fluidity thereof is also effective.

As apparent from the above description, according to the liquid metal ion source of the present invention, the element P which is important as an n-type impurity element for a silicon semiconductor and which has hitherto been deemed difficult of emission from a liquid metal ion source on account of the demerit of a high vapor pressure, or both P being the n-type impurity element and B being a p-type impurity element can be extracted as single-element ions efficiently and stably for a long time.

What is claimed is:

1. In a liquid metal ion source wherein a source material which contains a predetermined element to be ionized is melted and fed to a tip of an emitter so as to produce an ion beam under a high electric field; a liquid metal ion source characterized in that said source material is a Cu alloy which contains P, the alloy containing P in an amount of at most 25 at. %.

2. A liquid metal ion source as defined in claim 1, wherein the P content of said Cu alloy is 10-20 at. %.

3. A liquid metal ion source as defined in claim 1, wherein the P content of said Cu alloy is approximately 15.8 at. %.

4. A liquid metal ion source as defined in claim 1, wherein said Cu alloy further contains at most 15 at. % of B.

5. A liquid metal ion source as defined in claim 1, wherein said Cu alloy further contains at most 16 at. % of one element selected from the group consisting of Ag, C and Si.

6. A liquid metal ion source as defined in claim 4, wherein said Cu alloy further contains at most 10 at. % of one element selected from the group consisting of Ag, C and Si.

7. A liquid metal ion source as defined in claim 1, further comprising a reservoir which melts and holds said source material, said emitter being arranged so as to emit from its tip the ions of the melted source material fed from said reservoir, and an extracting electrode which applies the high electric field across it and said emitter so as to extract the ions from said tip of said emitter.

8. A liquid metal ion source as defined in claim 7, wherein said reservoir serves also as a heater for melting said source material.

9. A liquid metal ion source as defined in claim 7, wherein said reservoir is made of one element selected from the group consisting of Nb, Ta, Mo and C.

10. A liquid metal ion source as defined in claim 1, wherein said emitter is made of a material selected from the group consisting of W, Ta, C, SiC, WC, TiC and $LaB_6$.

11. A liquid metal ion source which comprises a source material to be melted, a reservoir for holding said source material, an emitter arranged to receive melted source material from said reservoir, means for heating the source material to a temperature at which the source material is melted, means for feeding the melted source material to a tip of the emitter and means for applying an electric field across the tip of the emitter and an ion extracting electrode to cause the emitter to emit ions from the melted source material; said ion source material comprising a Cu alloy which contains, P, the alloy containing P in an amount of at most 25 at. %.

12. A liquid metal ion source as defined in claim 1, wherein said Cu alloy consists of at most 25 at. % of P, at most 16 at. % of one element selected from the group consisting of Ag, C and Si, and the balance of Cu.

13. A liquid metal ion source as defined in claim 2, wherein said Cu alloy consists of 10-20 at. % of P, at most 15 at. % of B, at most 16 at. % of one element selected from the group consisting of Ag, C and Si, and the balance of Cu.

14. A liquid metal ion source as defined in claim 3, wherein said Cu alloy consists of approximately 15.8 at. % of P, at most 15 at. % of B, at most 16 at. % of one element selected from the group consisting of Ag, C and Si and the balance of Cu.

15. A liquid metal ion source as defined in claim 1, wherein said Cu alloy is a binary alloy.

16. A liquid metal ion source as defined in claim 1, wherein Cu alloy is a binary, tertiary or quaternary alloy containing Cu as the predominant transition element.

* * * * *